United States Patent [19]

Brune et al.

[11] Patent Number: 4,862,067
[45] Date of Patent: Aug. 29, 1989

[54] METHOD AND APPARATUS FOR IN-CIRCUIT TESTING OF ELECTRONIC DEVICES

[75] Inventors: William A. Brune, San Jose; Scott D. Grimes, Morgan Hill, both of Calif.

[73] Assignee: Schlumberger Technologies, Inc., San Jose, Calif.

[21] Appl. No.: 334,802

[22] Filed: Mar. 31, 1989

Related U.S. Application Data

[63] Continuation of Ser. No. 65,985, Jun. 24, 1987, abandoned.

[51] Int. Cl.$^4$ ............................................ G01R 15/12
[52] U.S. Cl. ............................. 324/73 R; 324/73 AT
[58] Field of Search ............ 324/73 R, 73 AT, 73 PC; 371/15, 20, 25, 26

[56] References Cited

U.S. PATENT DOCUMENTS

| | | | |
|---|---|---|---|
| 3,832,535 | 8/1974 | De Vito | 324/73 AT |
| 3,848,188 | 11/1974 | Ardezzone | 324/73 AT |
| 4,099,668 | 7/1978 | Feilchenfeld | 324/73 AT |
| 4,114,093 | 9/1978 | Long | 324/73 AT |
| 4,348,759 | 9/1982 | Schnurmann | 324/73 AT |
| 4,480,315 | 10/1984 | Hickling | 324/73 AT |
| 4,484,329 | 11/1984 | Slamka et al. | 324/73 AT |

Primary Examiner—Michael J. Tokar
Attorney, Agent, or Firm—Heslin & Rothenberg

[57] ABSTRACT

A system for in-circuit testing of an electronic circuit device utilizes a distributed processing architecture wherein separate controllers are used to control the testing and for data collection and correlation of the collected data to the testing conditons. In a preferred embodiment, the testing is conducted by sending test vector addresses from the test controller to each of the driver/sensor boards in the testor electronics, which addresses, in turn, are used to access driver memories containing the test conditions corresponding to the test vector addresses. In the method of the present invention, the circuit containing the device is powered up and a tester coupling mechanism is connected to the terminals of the device. Determinations are made of the physical orientation of the device with respect to the tester coupling mechanism, and of whether the device terminals are in electrical contact with the tester mechanism and with the other components of the circuit. Functional testing is the performed, and failure data resulting from the test are stored and correlated to the test conditions which were applied during the functional testing.

36 Claims, 11 Drawing Sheets

| ADDRESS | INSTRUCTION |
|---|---|
| 0 | IF NO TRIGGER, JUMP TO 0 |
| 1 | NOP |
| ... | ... |
| 3ff | JUMP TO 3ff |

FIG. 6(a)

| ADDRESS | INSTRUCTION |
|---|---|
| 0 | IF NO TRIGGER, JUMP TO 0 |
| 1 | IF NO TRIGGER, JUMP TO 1 |
| ... | ... |
| 3fe | IF NO TRIGGER, JUMP TO 3fe |
| 3ff | JUMP TO 3ff |

FIG. 6(b)

| ADDRESS | INSTRUCTION |
|---|---|
| 0 | IF TRIGGER, JUMP TO 6 |
| 1 | IF TRIGGER, JUMP TO 6 |
| 2 | "     "     "  "  " |
| 3 | "     "     "  "  " |
| 4 | "     "     "  "  " |
| 5 | IF NO TRIGGER, JUMP TO 0 |
| 6 | IF TRIGGER, JUMP TO 11h |
| 7 | "     "     "  "  " |
| 8 | "     "     "  "  " |
| 9 | "     "     "  "  " |
| A | "     "     "  "  " |
| B | IF TRIGGER, JUMP TO 11h |
| C | "     "     "  "  " |
| D | "     "     "  "  " |
| E | "     "     "  "  " |
| F | "     "     "  "  " |
| 10 | IF NO TRIGGER, JUMP TO B |
| 11h | IF TRIGGER, JUMP TO 20h |
| 12 | |
| 13 | |
| 14 | |
| 15 | |
| ... | |
| 3ff | JUMP TO 3ff |

FIG. 6(c)

METHOD AND APPARATUS FOR IN-CIRCUIT TESTING OF ELECTRONIC DEVICES

This application is a continuation of application Ser. No. 065,985 filed June 24, 1987, now abandoned.

BACKGROUND OF THE INVENTION

This invention relates to testing electronic devices while they are connected in an operable circuit. More particularly, it relates to testing integrated circuit devices while they are mounted on a circuit board, to verify that they function as designed. In one embodiment, the invention is especially useful for automatically testing integrated circuits packaged as DIP (dual-in-line package) components mounted on printed circuit boards (PCB's).

As the complexity and packaging density of circuit devices continues to increase, testing and servicing such devices also becomes more complex and time consuming. In a typical electronic assembly, many, many electronics components are combined in an integrated circuit which is typically packaged as a DIP having between 16 and 64 pins. These integrated circuit DIPs are usually mounted on a printed circuit board which contains electrically conductive paths which connect various pins of each DIP to other circuit components on the board. A number of these printed circuit boards are then connected together to form a functional electronic assembly.

In the past, schemes have been devised for testing the functionality of various DIP components before they are assembled on the board. Such testing has usually been accomplished by subjecting the pins of the DIP to a prescribed verification procedure, using a testing apparatus in which each DIP is inserted so that the pins thereof are in contact with appropriate pin-contacting receptacles of the test apparatus.

However, it is often desirable and/or necessary to test these same integrated circuit devices after they have been assembled into operable circuits. For example, when a number of integrated circuits are mounted on a printed circuit board and it is determined that the board assembly itself is not functioning properly, it is desirable to ascertain whether any of the integrated circuit packages mounted on the board are the cause of the malfunction. It is also desirable to be able to determine if each integrated circuit is properly connected to the circuit board. It is necessary to be able to make these determinations while the devices are mounted on the circuit board. Moreover, because only a limited amount of time is available to test each device in order to provide a practical throughput for the testing system, the testing procedure must be capable of being performed very quickly. Additionally, in order for such testing to be cost effective, the testing system should be configured so as to facilitate programming and debugging of the testing procedure.

Accordingly, it is an object of the present invention to provide a system for testing the integrity and performance of electronic devices while they are connected in an operable circuit.

It is a further object of the present invention to provide an in-circuit testing system for testing integrated circuits mounted on a printed circuit board.

It is another object of the present invention to provide a testing system having a high rate of throughput.

It is also an object of the present invention to provide a testing system for which the testing procedure is easily debugged.

SUMMARY OF THE INVENTION

In accordance with one aspect of the present invention, a method for testing an electronic circuit device while the device is electrically connected in the circuit for which it is to be employed comprises applying electrical power to the circuit containing the device, so as to activate the circuit. A tester coupling mechanism is connected to the terminals of the circuit device, and the physical orientation of the device terminals with respect to the coupling mechanism is determined. Determinations are also made of whether the device terminals are all in contact with the coupling mechanism, and whether the device terminals are properly electrically connected to the circuit containing the device. In one embodiment, the method further comprises functionally testing the device by applying prescribed electrical stimulus signals to preselected ones of the device terminals and comparing the electrical signals appearing at the device terminals in response to the stimulus signals with predetermined standards. In order to facilitate debugging of the test program, the method may further comprise storing the signals appearing at the device terminals in response to preselected stimulus signals applied thereto, and correlating the stored signals with the test conditions being applied to the device when the stored signals were obtained.

In accordance with another aspect of the present invention, apparatus for performing the type of in-circuit testing described above comprises means for applying electrical power to the circuit containing the device, and means for generating a sequence of test control signals in accordance with which the device is to be tested. The apparatus also includes a plurality of driver storage means which are configured for storing the electrical stimulus-representative signals which, during testing, result in selective application of the prescribed stimulus signals to the device terminals. A plurality of driver circuit means is associated with the plurality of driver storage means, with the driver circuit means being responsive to the driver storage means so as to controllably generate electrical stimulus signals for application to the circuit device terminals. Also included in the inventive apparatus is means for coupling the electrical stimulus signals to the respective terminals of the device to be tested. The apparatus further comprises means for monitoring the electrical signals appearing at the device terminals in response to the applied stimulus signals.

BRIEF DESCRIPTION OF THE DRAWINGS

The subject matter which is regarded as the invention is particularly pointed out and distinctly claimed in the concluding portion of the specification. The invention itself, however, both as to its organization and its method of practice, together with further objects and advantages thereof, may best be understood by reference to the following description taken in conjunction with the accompanying drawings, in which:

FIGS. 6(a), 6(b) and 6(c) show examples of program listings which may be utilized for data collection in accordance with the method of the present invention;

DETAILED DESCRIPTION OF THE PREFERRED EMBODIMENTS

Figure 1:
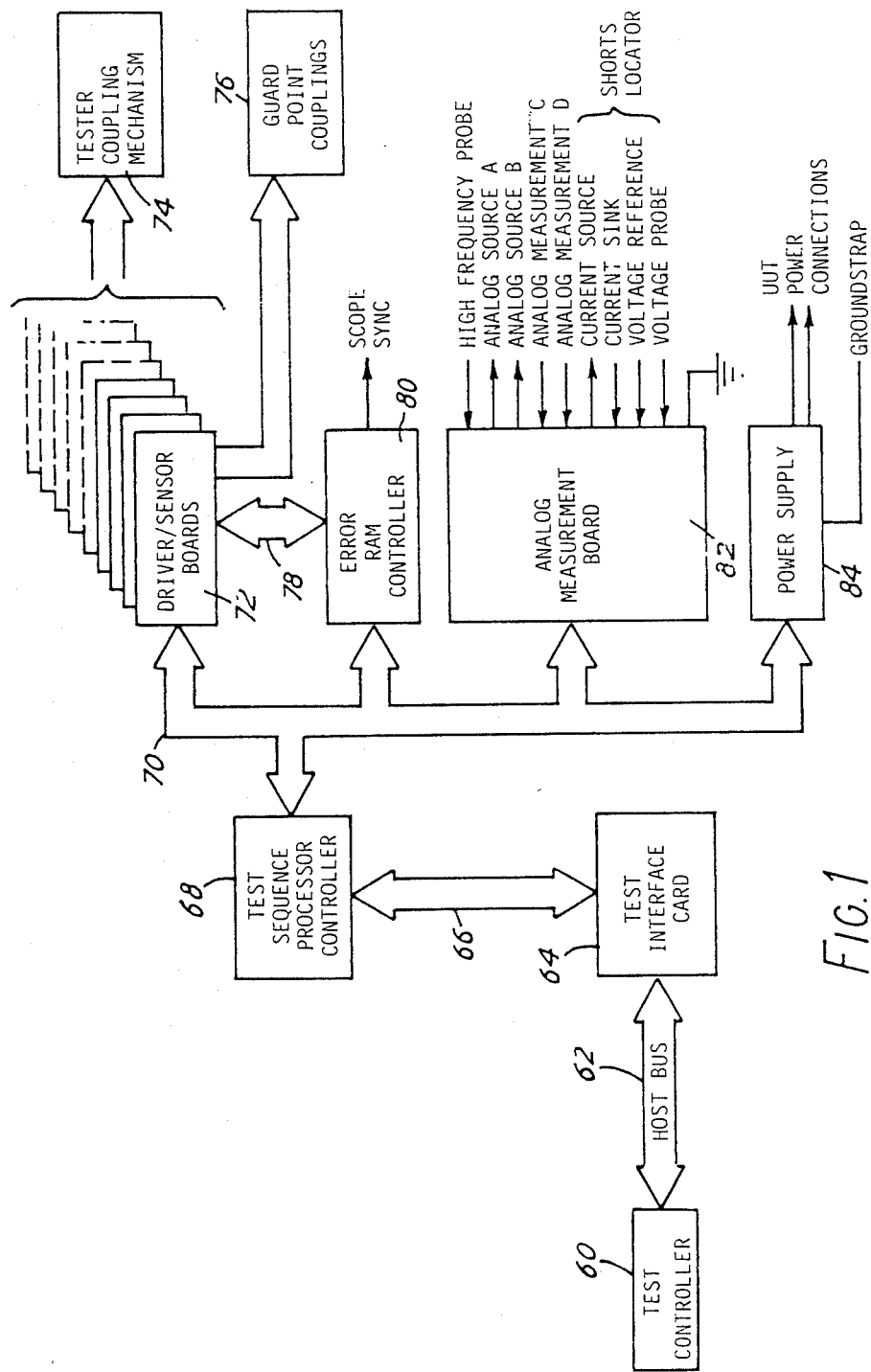
FIG. 1 is a block diagram schematically illustrating one embodiment of an in-circuit testing system, in accordance with the present invention.

FIG. 1 schematically illustrates one embodiment of a system for in-circuit testing of electronic devices, in accordance with the present invention. The novelty of the instant invention resides primarily in a unique combination of conventional data storage, signal processing, and interface circuit components. Accordingly, the structure, arrangement, and control of the components of the invention have been illustrated in most of the Figures using readily understandable block representations which show only those details which are pertinent to an understanding of the invention. Details which will be readily apparent to those skilled in the art having the benefit of the description herein, and which, if included herein, might obscure the disclosure of the present invention, have been omitted. Therefore, the block diagram illustrations in the Figures do not necessarily represent the structure or arrangement of an exemplary testing system, but rather are intended to depict the major components of such a system in a convenient functional grouping which facilitates an understanding of the invention. As illustrated in FIG. 1, in one embodiment of an in-circuit testing system, test controller 60 is employed to host and manage the various tasks required to perform the testing function. Controller 60 conveniently comprises a computer of the type which has become known as a personal computer, such as, for example, an IBM Model PC/AT. Coupled to controller 60 by means of host computer bus 62 is test interface card 64. Interface card 64 serves primarily as a buffer between host computer bus 62 and the rest of the tester electronics. Card 64 may also be employed to provide serial and parallel ports for peripheral equipment, as well as for interfacing tester operating controls to controller 60. With interface card 64 being disposed as shown, control programs for operating the other portions of the tester electronics may be supplied from controller 60 to test sequence processor controller 68 via link 66. When processor 68 comprises what is known as a bit-slice processor, the testing system of FIG. 1 is operable in a distributed processing mode. In such an operating mode, the tester electronics has its own "intelligence" and can perform testing functions without continuous supervision from the host computer. Therefore, the host computer is able to stage the next program in a test sequence while the current one is being performed by controller 68, thereby enhancing system throughput by reducing the time required to load the next test program. Distributed processing also allows the testing system to use data compression techniques in the testing cycle.

Processor 68 controls driver/sensor boards 72, error RAM (Random Access Memory) controller 80, power supply 84, and optional analog measurement board 82, all of which are coupled to processor 68 via link 70. CRC (Cyclic Redundancy Check) measurements and system calibration are also controlled by processor 68. Processor 68 loads the memories of driver/sensor boards 72 with the proper test parameters, controls the test sequencing, and sends failure data back to test controller 60. Thus, test sequence processor 68 serves as the primary interface between the tester electronics and the host computer, and effectively controls almost all facets of the testing.

Figure 2:
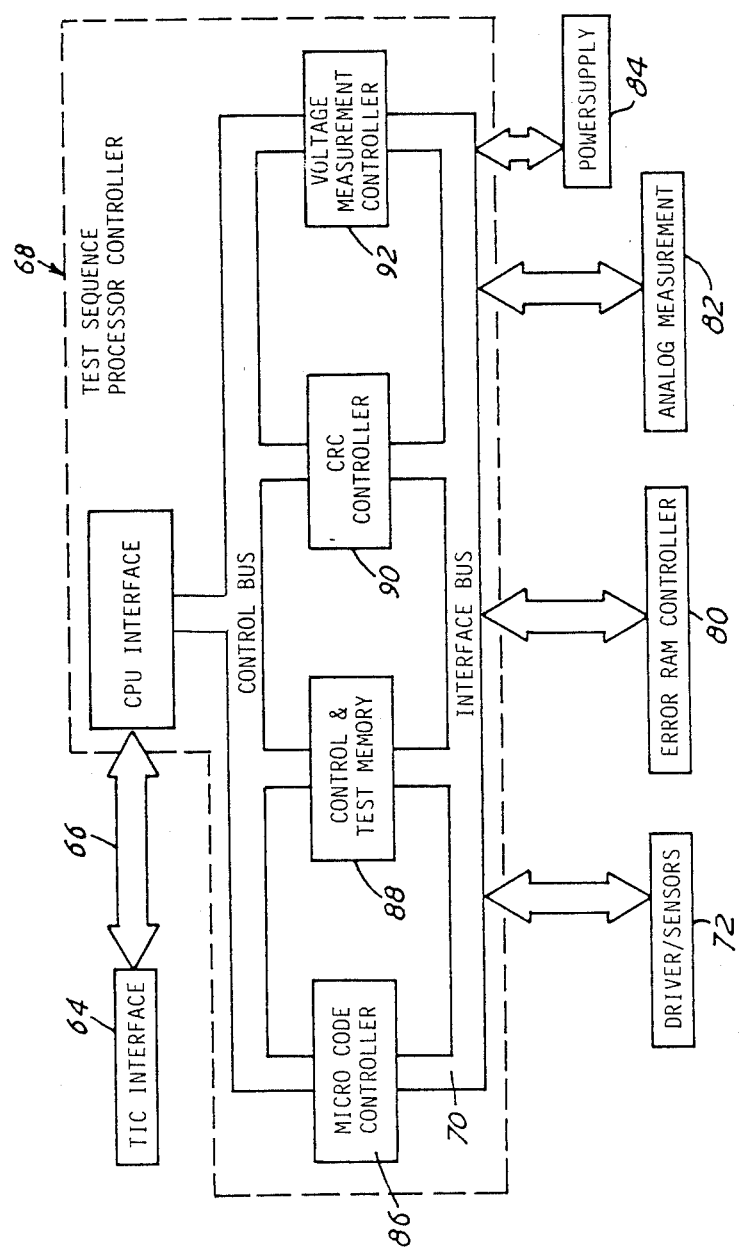
FIG. 2 is a block diagram of one embodiment of the test sequence processor shown in FIG. 1.

FIG. 2 is a block diagram schematically illustrating one embodiment for test sequence processor 68 in more detail. As was previously stated, processor 68 is preferably driven by what is known as a bit-slice processor, shown in FIG. 2 as microcode controller 86. The actual microcode processor instructions are stored in control and test memory 88. The instructions residing therein provide the processor interface and control functions described above. The microcode instructions also include operation of CRC controller 90. Although the actual CRC signatures are generated on driver/sensor boards 72, the timing signals for starting and stopping the CRC generation are provided by CRC controller 90. Processor 68 further provides voltage generation and measurement functions. For example, all reference voltages used by the tester electronics, including high and low voltage thresholds and high and low driver voltages, are generated by voltage measurement controller 92. Also, operation of power supply 84 is controlled by processor 68. The voltage generation and measurement function of processor 68 may also be employed to measure the tester power supplies when turning the system on, and for operation of internal self-test diagnostics for the system.

Figure 3:
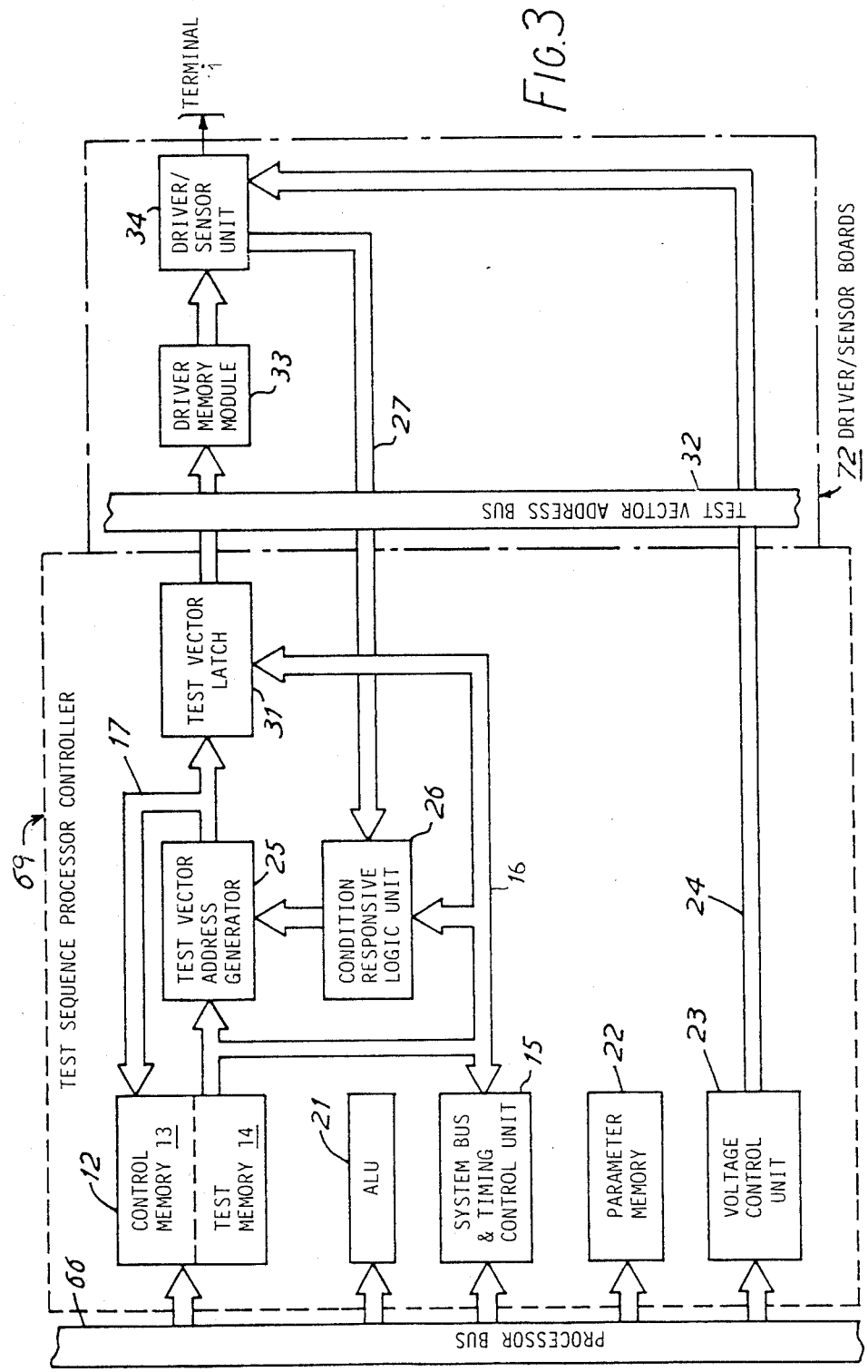
FIG. 3 is a block diagram schematically illustrating an alternative embodiment for the test sequence processor shown in FIG. 1.

FIG. 3 is a block diagram schematically illustrating a slightly different embodiment for the test sequence processor controller, which is designated in FIG. 3 as controller 69. FIG. 3 also illustrates one embodiment of the manner in which the test sequence processor may be coupled to driver/sensor boards 72. As shown in FIG. 3, processor 69 includes arithmetic logic unit (ALU) 21 and associated data parameter memory 22, as well as system bus and timing control unit 15, each of which is coupled to processor bus 66. These components may comprise conventional computer processing and signal coupling units that interface with each other according to known hardware configuration schemes. One example of such a processor architecture is the Motorola 68000 hardware configuration, and further details concerning such configurations may be obtained from this commercially available hardware and/or computer data books explaining the same.

Processor 69 also includes memory unit 12 which is subdivided into control memory 13 and test memory 14. Control memory 13 contains instructions for processor 69 to perform system control functions such as calibration, loading, and on-line diagnostics. The instructions contained in control memory 13 are typically executed by decoding the stored instruction, manipulating appropriate data in ALU 21 and parameter memory 22, and generating the address for the next instruction to be processed, based upon the results of the data manipulation step. The processor instructions which are stored in control memory 13 are conveniently loaded into processor 69 by the host computer during system initialization procedures.

The instructions stored in test memory 14 may also be loaded by the host computer during system initialization. Test memory 14 contains processing instructions which enable the testing system to rapidly sequence through a series of test vectors which, in turn, access electrical stimulus signals which are applied to the circuit device being tested. For a respective device terminal to which electrical stimulus signals are to be applied, a plurality of digital codes which correspond to the respective electrical stimulus signals are stored in respective memory locations of driver memory module 33 located on driver/sensor board 72. These digital codes are written to memory module 33 during execution of the processor instructions stored in control memory 13 which correspond to the system loading program.

The test vectors themselves are generated in address generator 25 which is coupled to memory unit 12 and to condition responsive logic unit 26. Address generator 25 preferably comprises the type of processor known as a bit-slice processor, such as, for example, the 2910 microcode sequencer manufactured by AMD Corporation. Such a processor decodes the contents of a processor instruction coupled from memory unit 12, accounts for any system conditional control input supplied by logic unit 26, and produces from those inputs a test vector which is a code corresponding to the address of the next instruction to be executed. This address code is coupled to memory unit 12 via link 17, and also to test vector address bus 32 via switchable test vector latch 31. The test vector address code is distributed along address bus 32 for application to the respective driver memory modules 33 for each of the device terminals. In this manner, the address codes that are produced on link 17 to access further instructions from memory unit 12 are also employed for accessing the digital codes stored in memory module 33, which codes, in turn, correspond to the electrical stimulus signals required for testing the circuit device. That is, the address of the next instruction in test memory 14 operates as a test vector which accesses the appropriate stimulus signals in driver/sensor boards 72. Thus, both test memories 14 and memory module 33 respond to the same address produced by generator 25.

As stated previously, the address signals generated by generator 25 are coupled to driver memory module 33 through test vector latch 31. Latch 31 is controlled by memory-space-defining bits which form a part of the information conveyed to generator 25 from memory unit 12 via link 16. These information bits indicate from which of the two sections of memory unit 12 an instruction is being accessed. For instructions accessed from test memory 14, latch 31 simply buffers the address generated by address generator 25, thereby permitting this address code to be coupled to address bus 32 for distribution to each memory module 33. However, for addresses located in control memory 13, this sequencing through successive test vectors is interrupted, and the last address code which is currently buffered in vector latch 31 is held or latched therein as a pointer to the next address in test memory 14 which will be accessed when the instructions located in control memory 13 are completed. If desirable, logic unit 26 may include logic functions which monitor prescribed conditions within the system and which cause address generator 25 to abort further access to test memory 14 upon occurrence of certain conditions. In that case, address generator 25 may be configured to generate an address which references an exit routine contained in control memory 13.

Voltage control unit 23 serves to provide driver/sensor unit 34 with the driver and threshold voltages required for testing of the circuit device. Of course, while only one memory module 33 and one driver/sensor unit 34 have been shown in FIG. 2 as forming part of a respective device terminal test channel, it is to be understood that an actual testing system includes a plurality of such memory modules and driver/sensor units, one for each terminal of the device being tested. The present invention is capable of testing circuit devices having virtually any number of terminals, consistent with the signal processing and connector limitations of commercially available associated data processing equipment. Currently, many integrated circuits are packaged as DIPs having between 8 and 64 terminals. Thus, for example, in a testing system capable of checking the in-circuit operation of an electronic device having 64 such terminals, 63 additional driver memory modules 33 and associated driver/sensor units 34 are distributed along test vector address bus 32. Also, for such a multi-terminal device, link 27 would be coupled through multiplexer circuitry which has been omitted from FIG. 3 for the sake of clarity.

Figure 4:
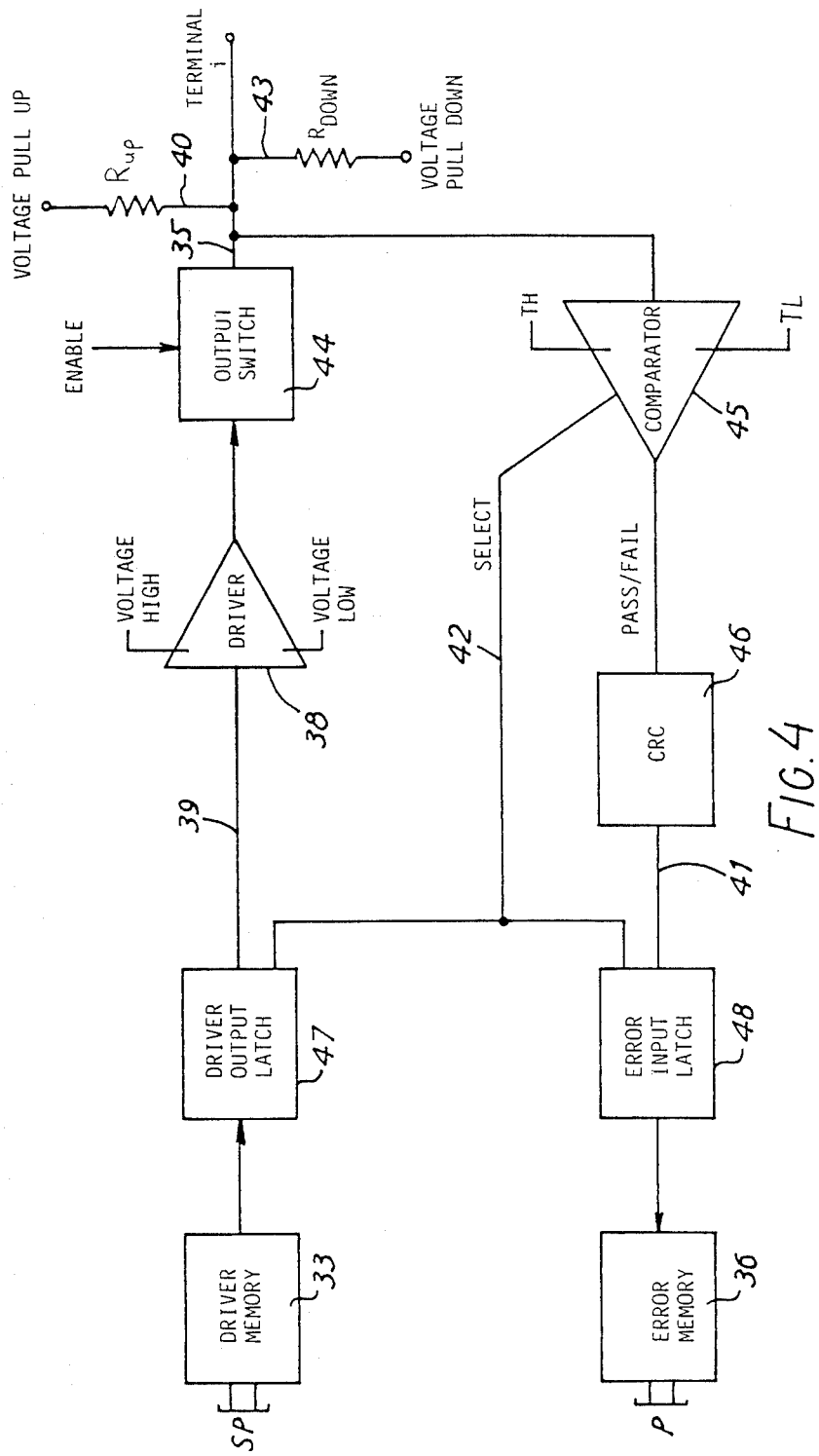
FIG. 4 is a schematic diagram illustrating one embodiment for the driver/sensor board shown in FIG. 1.

FIG. 4 is a functional block diagram showing in greater detail one of the device terminal channels of a driver/sensor board. Each channel has driver memory 33 and error memory 36 coupled to test sequence processor 68. Driver memory 33 stores these stimulus-representative electrical signals received from processor 68 during test initialization. In response to the test vector address codes received by driver memory 33 during testing, these stimulus-representative electrical signals are coupled to driver output latch 47, which stimulus-representative signals are, in turn, coupled via link 39 to driver 38, where they are converted to prescribed electrical stimulus signals for application to the respective terminal of the device being tested. The coded information sent from latch 47 to driver 38 includes selection of either a high or a low logic level signal and a signal for enabling driver 38. The actual voltage level applied to the device being tested is controllable by voltage measurement controller 92, by varying the values of "voltage high" and "voltage low" shown in FIG. 4.

The output of driver 38 is linked to the respective terminal of the device being tested by output switch 44. With output switch 44 "enabled", the output of driver 38 is coupled to output line 35 of switch 44. On the other hand, if the device terminal associated with output line 35 should be selectively nondriven, the "enable" signal may be discontinued, in response to which output switch 44 disconnects the output of driver 38 from output line 35. In one embodiment, switch 44 comprises a pair of emitter-coupled switching transistors, the emitters of which are connected to the gate of an MOS transistor switch. The use of an MOS switching transistor in this manner permits the output of driver 38 to be readily placed in a high impedance condition, while also allowing switch 44 to have low output resistance and to conduct relatively high currents. As is also shown in FIG. 4, for applications where it is desirable, output line 35 may be connected to various terminators, such as pulldown terminator 43 or pullup terminator 40.

Comparator 45 is employed to monitor the signal appearing at the respective terminal of the device being tested, in response to the electrical stimulus signal being applied thereto. Comparator 45 preferably comprises a dual-threshold, high-speed device which may be employed in two different manners. When employed as a pass/fail indicator, comparator 45 typically compares the voltage on output line 35 with upper and lower voltage thresholds, designated in FIG. 4 by "TH" and "TL", respectively. A pass or fail output is provided by comparator 45, depending upon whether or not the appropriate threshold level is exceeded. When comparator 45 is used to measure the voltage appearing at output line 35, the reference inputs "TH" and "TL" are ramped through a series of voltages in a technique known as "successive approximation", and comparator 45 is monitored for pass conditions. When the voltage has been determined in this manner, it is compared to the expected value and a pass/fail test status is determined.

Driver output latch 47 supplies information concerning the status of driver 38 for each state of the test to error input latch 48, where the information is latched upon receipt of a latching signal, typically from comparator 45 via link 41. Comparator 45 is typically enabled by a select signal received from driver output latch 47 via link 42. Finally, the pass/fail data from comparator 45 is stored in error memory 36. The address for each piece of data in memory 36 is the same as the test vector memory in the error random access memory controller (described hereinbelow), thereby providing the ability to relate the pass/fail data to the information concerning driver 38 for each test state.

While not necessary for the testing system of this invention, for applications where it is desirable, CRC generator 46 may be coupled between the output of comparator 45 and the input to error memory 36. The benefits of such data compaction techniques are well known, as are the methods and circuitry for doing so. Furthermore, for certain applications data compaction techniques other than CRC generation may be preferred. Similarly, although it is preferred to employ driver memory 33 and output latch 47 for each terminal of the device to be tested, in the manner illustrated in FIG. 4, the testing system of the present invention would operate even without memory 33 and latch 47. The benefit provided by those components is that all of the device terminals may be tested simultaneously, with each testing channel responding to the same address and independently performing its portion of the testing.

Output lines 35 of the respective test channels are connected to the associated terminals of the device to be tested by means of tester coupling mechanism 74 illustrated in FIG. 1. Typically, mechanism 74 comprises a clip-on device that attaches to the pins of a dual-in-line packaged integrated circuit. Power supply 84 attaches to the circuit containing the device to be tested in such a manner that the circuit is activated.

Figure 5:
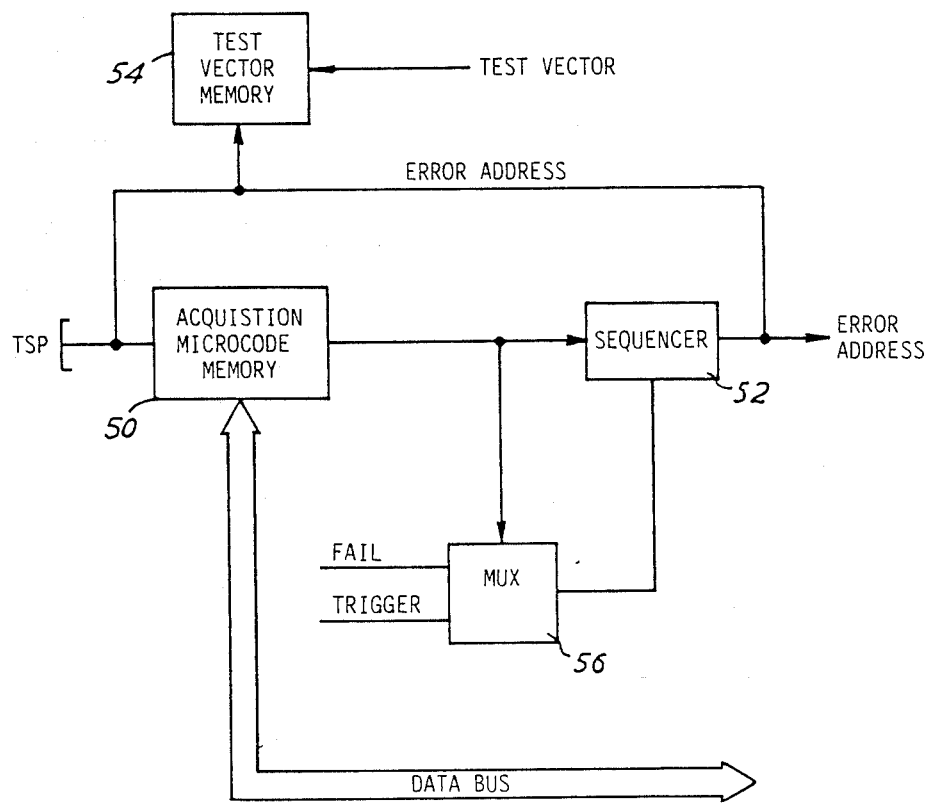
FIG. 5 is a schematic diagram illustrating one embodiment for the error RAM controller shown in FIG. 1.

Error RAM controller 80 determines the conditions under which pass/fail data from comparator 45 is stored in error memory 36, as well as providing the address for the stored data. FIG. 5 schematically illustrates one embodiment for controller 80. The error acquisition microcode is loaded into memory 50 from processor 68 and is used to control sequencer 52 so as to generate the error address used to store error data in memory 36. Test vector memory 54 of controller 80 receives test vectors from driver sensor boards 72, which test vectors are the addresses of the data going out of error memory 36. Multiplexer 56 determines which test data should be recorded, in response to preselected combinations of the fail and trigger signals. Finally, for testing systems not intended to store failure data, error RAM controller 80 is replaced by circuitry which simply indicates the existence of a failure to the testing operator.

In order to facilitate testing of hybrid PCBs, that is, circuit boards having both digital and analog circuits thereon, analog measurement board 82 may be included in the testing system of the present invention. Board 82 can simulate an analog circuit with two programmable sine wave channels, and measure the circuit's response with two additional channels. Board 82 may also be configured to provide probes for DC voltage measurement, high frequency measurement, and microvoltmeter-type detection of electrical shorts. Board 82 may be further configured so that it is operable either in conjunction with the testing program, or independently thereof.

From the above description it is apparent that, in accordance with the present invention, an apparatus for testing an electronic circuit device while the device is electrically connected in the circuit for which it is to be employed comprises means for applying electrical power to the circuit in such a manner as to activate the circuit devices therein, using the type of power supply shown in FIG. 1 as power supply 84. The apparatus also comprises means for generating a sequence of test control signals which are used to test the device, such as test sequence processor 68. A plurality of driver storage means, such as driver memory module 33 shown in FIG. 3, are associated with respective ones of the device terminals and are configured for storing the electrical stimulus-representative signals from the generating means. A plurality of driver circuit means, such as drivers 38, are associated with the driver storage means and are responsive to the electrical stimulus-representative signals contained therein so as to controllably generate electrical stimulus signals for application to the associated circuit device terminals. The electrical stimulus signals are coupled to the circuit device terminals by a coupling mechanism such as coupling mechanism 74. The apparatus of the present invention also includes means for monitoring the electrical signals appearing at the circuit device terminals in response to application of the stimulus signals thereto. In a preferred embodiment, the apparatus further comprises means for generating sensor-representative electrical signals which correspond to the electrical signals monitored by the sensing means, and means for storing predetermined ones of the sensor-representative signals, in the manner illustrated in FIG. 4 by comparator 45 and error memory 36. To facilitate program debugging, the testing apparatus may also include means for determining which of the sensor-representative signals are to be stored, and means for correlating the stored sensor-representative signals with the particular stimulus-representative signals being applied to the driver circuit means while the electrical signals associated with the stored sensor-representative signals are being monitored. Finally, for many testing applications, it is desirable to establish predetermined initial testing conditions at preselected locations in the circuit containing the device to be tested. For those applications, the apparatus of the present invention may further comprise means for applying prescribed electrical signals to those preselected locations, through the use of the same type of driver/sensor boards described above and additional tester coupling mechanisms of the type designated in FIG. 1 as guard point couplings 76.

The testing system of the present invention provides a method for testing an electronic circuit device while the device is electrically connected in the circuit for which the device is to be employed, when the device has a plurality of electrical terminals through which the device is operated in accordance with its intended circuit function. The inventive testing scheme may be utilized to verify that the circuit device is properly connected to the other components of the circuit. It may also be utilized to verify the functional performance of the circuit device in accordance with some predetermined standard, such as, for example, the device's truth table. To accomplish the functional testing, signals are injected into the terminals of the device which temporarily overpower the effects on the device of any other electrical components connected thereto. The device terminals are overdriven for only a short period of time, so as to not damage the device itself and other circuit components connected to it. In the method of the present invention a tester coupling mechanism is attached to the device under test, and electrical power is applied to the circuit containing the device in order to activate the circuit.

Next, a series of verification tests are performed. First, the physical orientation of the circuit device terminals with respect to the tester coupling mechanism is determined. In one embodiment, this determination is made by comparing the electrical signals appearing at preselected ones of the circuit device terminals with the signals expected at those preselected terminals when the circuit device terminals are in a predetermined physical orientation with respect to the tester coupling mechanism. For circuit devices which are packaged as DIPs, the physical orientation may be checked simply by measuring the voltage appearing at the device terminals which correspond to the device's supply voltage and electrical ground.

The second verification test in the inventive test scheme is designed to confirm not only that all of the terminals of the device to be tested are in electrical contact with the tester coupling mechanism, but also that those terminals are connected to other components in the circuit containing the device to be tested. This test is performed by verifying that the circuit device being tested can overdrive resistive loads connected to it by the testing apparatus. For each of the circuit device terminals, a prescribed electrical stimulus signal is applied through the tester coupling mechanism to the device terminal, and the electrical signal appearing at the terminal in response to the stimulus signal is monitored. Whether the device terminal in question is in electrical contact with the tester coupling mechanism is determined by the response signal obtained as a result of applying the prescribed stimulus signal. In one testing scheme, it is established that the device terminal is in electrical contact with the coupling mechanism when the response signal obtained is substantially different from the stimulus signal. For binary logic electronic devices, this test may be performed by applying high logic level signals through pull-up resistors to all of the device terminals, and then checking to see if the voltage across any of the resistors has dropped below the high logic level. Any terminal appearing at a low logic level indicates that a load has been placed on the resistor from the output of the device being tested, so that the tester is assumed to be connected to the device. For those terminals which stay at a high logic level, a low logic level input signal is then applied thereto through pull-down resistors. If those pins are, indeed, connected to the tester, the device will again change the voltage across the resistor. Thus, in this portion of the test, any terminal appearing at a high logic level is assumed to be connected to the tester. Any device terminal that stays at the driven state for both high and low logic level inputs is either not in electrical contact with the tester, or is not connected to the circuit containing the device.

The last verification test is intended to confirm that the device being tested is properly connected in its circuit. This last test checks the connections between the circuit and the device terminals corresponding to the device's supply voltage and electrical ground as well as unintentional connections between other pins of the device and the supply voltage and ground. The test also checks for electrical shorts both between terminals of the device that are intended to be connected together, and terminals of the device which are not so intended. In one embodiment, this portion of the test is performed by first determining whether the terminals of the circuit device which correspond to power supply and voltage ground are connected to the power supply and ground voltage potentials provided by the circuit which contains the circuit device. It is then determined whether any of the terminals of the device, other than those terminals corresponding to the device's power supply and ground, are connected to the power supply and ground electrical potentials provided by the circuit. Finally, determinations are made of whether the terminals of the device which are intended to be electrically shorted to each other, when the device is connected to the circuit which contains the device, are the only terminals connected together, and that no other terminals are electrically shorted to those terminals just described. When the circuit device comprises a binary logic device, one method for making these determinations is to measure the voltage appearing at the device terminals which correspond to power supply and electrical ground. If these voltages are correct, these terminals are ignored for the rest of the test. Next a DC voltage which corresponds to a high logic level for the device is applied to one of the device terminals which are intended to be electrically shorted to each other, and the driven terminal is checked to verify that the voltage appearing there at reaches a high logic level. A DC voltage which corresponds to a low logic level for the device is then individually applied to each of the other terminals which are intended to be electrically shorted together, and the electrical signals appearing at those device terminals are monitored. If the device terminal which is individually being driven to a low logic level is successfully driven to that low level, it is assumed that the terminal is not connected to the others since it is not driving against another in-circuit driver, as it would be if it was shorted to the intended terminals. After confirming that the device terminals intended to be shorted together are connected, all of those terminals are treated as a single device terminal and a DC voltage which corresponds to a low logic level is applied to all of the remaining terminals except for those corresponding to the power supply and electrical ground. The electrical signal appearing at each of those remaining terminals is monitored, and any of those terminals for which the signal appearing there at is substantially different from the applied low logic level signal is considered to be shorted to the power supply electrical potential. Any such terminals are ignored for the remainder of the test. Finally, a DC voltage which corresponds to a high logic level is individually applied to each of the remaining terminals except for those corresponding to power supply and ground potentials. The electrical signal appearing at the driven terminal is monitored, and any terminal for which the signal appearing there at is substantially different from the applied high logic level signal is considered to be shorted to one of the device terminals being held at a low logic level. A search can then be made of the terminals which are being driven at a low logic level, and any such terminal which is not successfully being held at a low level is considered to be shorted to the terminal which was not successfully driven to a high level.

The method of the present invention may further comprise functionally testing the circuit device by applying prescribed electrical stimulus signals to preselected ones of the circuit device terminals and comparing the electrical signals appearing at those terminals in response to the stimulus signals with predetermined standards. Preferably, the functional testing is conducted in accordance with the determination of the physical orientation of the device terminals with respect to the tester coupling mechanism. If the device orientation is determined to be "reversed" from what it should be, the test file supplied from the host computer for carrying out the functional testing of the device may be placed into test memory by taking into account the reverse order of the device terminals. In one embodiment, the reversal is accomplished by storing a duplicate file of the functional test in the host computer with pin designation addresses pre-established for a "reversed" integrated circuit. In one embodiment, the functional testing is conducted independently of whether the device has passed the verification checks described above, and the data obtained is sorted later to determine which data constitutes valid functional testing. However, it is often more useful to ensure that the device is properly connected to the circuit and to the tester coupling mechanism before performing the functional testing. Also, in some instances, it will be necessary in the method of the present invention to apply prescribed electrical signals to preselected locations in the circuit containing the device to be tested, so as to establish predetermined initial testing conditions in the circuit. Additional device coupling mechanisms such as guard point couplings 76 shown in FIG. 1 may be connected to other points on the printed circuit board to establish proper conditions for performing the functional test. Utilization of such guard points allows proper testing for such configurations as feedback loops, wired ORs, open collector buffers, and buss-structured PCBs.

In one particularly useful mode of testing in accordance with the instant invention, the testing apparatus automatically determines when the tester coupling mechanism has been properly attached to the circuit device to be tested, and then performs the verification test as well as a functionality test. In this automatic test mode, power is continuously applied to the circuit containing the electronic device, and the testing apparatus verifies that the power terminals of the device are connected to the proper portions of the tester coupling mechanism. Once voltages within the proper levels have been measured on those terminals, the tester repeatedly performs the test which determines whether the tester coupling mechanism is in electrical contact with all of the terminals of the device. Upon obtaining three consecutive indications from this test that contact has been established, the testing system determines that proper contact has been made between the coupling mechanism and the device terminals, and the verification test which establishes whether the circuit device is also properly connected to the circuit board is performed. Three successful passes of the contact verification test are provided in order to minimize the effects of contact bounce. After performing the functional test, the tester again begins executing the contact verification procedure. Once a failure of this test is obtained, the tester assumes that the device coupling mechanism has been removed from the circuit device and is in the process of being moved to the next circuit device. Accordingly, the tester then loads the test program for the next circuit device.

For many testing procedures, it is often useful to include as part of the testing method the step of storing as failure data the electrical signals appearing at the device terminals in response to the stimulus signals applied thereto, when the response signals are substantially different from preestablished standards therefor. Furthermore, in order to facilitate debugging of testing programs for functionally testing circuit devices which require a large number of testing steps, the method of the present invention preferably further comprises correlating the failure data signals to the particular test conditions and stimulus signals being applied as part of the functional testing when the failure data occurs. For such circuit devices, the functional testing typically comprises executing a programmed sequence of prescribed testing conditions which cause prescribed stimulus signals to be applied to preselected ones of the circuit device terminals, in accordance with the executable statements contained in a program source file. Additionally, it is often useful to store as test data the electrical signals appearing at the circuit device terminals in response to the programmed stimulus signals during preselected ones of the sequence of programmed test conditions, regardless of whether such signals constitute failures or expected data. In such a method, data may be collected either before, after, or both before and after a failure occurs.

In one embodiment of a testing method in which the data resulting from the testing is correlated to the stimulus signals applied during the test, a unique state address is assigned to each executable statement contained in the program source file. A directory file is generated which includes a listing of all of the program statements contained in the source file, with each statement being listed each time it is encountered in the program's sequence. The statements are listed in the order encountered in the program's sequence. Generating such a directory file serves to expand out any loops or jump statements in the program source file, and to create a sequential listing of the source statements. Associated with each executable program statement in the directory file is the unique state address which is assigned to that executable statement. A device terminal data file is also generated, which file includes a listing of all of the test data and all of the failure data which was collected by monitoring the signals appearing at the device terminals in response to the stimulus signals applied thereto. The test data and the failure data are listed in the order that they occur during the program sequence. Associated with each element of the device terminal data file is the same state address which is associated with the corresponding executable statement in the directory file, which corresponding statement was being executed when the respective device terminal data file element occurred. Finally, each executable statement in the directory file is linked with the elements of the device terminal data file which have the same state address as the executable statement in question. Preferably, each executable statement is linked to the first occurrence of an element in the device terminal data file which has the same state address as the excutable statement involved. Other indexes or pointers are then utilized to link the executable statement with succeeding occurrences of the same state address.

One embodiment of a testing method which includes the type of device terminal data correlation described above is schematically illustrated in FIGS. 6–9. The steps involved in the data collection and correlation procedure illustrated can be broadly described as follows: (1) load the microcode into the test sequence processor, (2) load the test file for the particular circuit device being tested into the controller memory, (3) initialize the error RAM controller for data collection, (4) execute the functional test and collect the device terminal data, (5) read the device terminal data from the error memory, and (6) connect the device terminal data to the source code statements.

For the type of testing system illustrated in FIG. 1, the test sequence processor preferably comprises a microcode driven bit-slice processor. For such a system, the microcode for the bit-slice processor is stored in the test controller memory and is loaded into the test sequence processor after the tester is powered up. In step (2), test controller 60 loads into the control and test memory of the test sequence processor a previously compiled binary file which has been generated from a source file written in an appropriate programming language. In the example shown in the Figures, the programming language shown is called "CHIPS" and is a coding scheme which represents the parameters of the drivers for the various test states. However, the programming language utilized may be any language that results in the drivers applying prescribed signals to the circuit device terminals and in the sensors monitoring the resulting signals there at. The binary file generated from the source file is composed of test vectors which control the operations being performed by the driver/sensor boards.

The error RAM controller also preferably comprises a microcode driven bit-slice processor. The microcode for operating the error RAM controller is generated by the test sequence processor and is dependent upon the specific data collection mode for the test program loaded. In one mode, the data is collected sequentially for a specified number of test states after a trigger is received from the test sequence processor. In a second collection mode, data is collected for a specified number of states before and/or after the trigger is received. Since the microcode generated by the test sequence processor to implement either of these two data collection modes depends upon the length of the test vectors, the type of data collection, and the starting address of the test, the error controller microcode cannot be generated until the test program is loaded.

When data is collected in the sequential data collection mode, the microcode written to the error RAM controller's memory must provide a means for looping on the first address in the device data memory until the trigger is received from the test sequence processor indicating that data collection should commence. An example of such a program listing, written in the type of language used for the 2910 microcode sequencer manufactured by AMD Corporation, is shown in FIG. 6(a). At address 0, the command of JUMP TO ADDRESS 0 IF NO TRIGGER is present and results in the sequencer looping at the first address until a trigger is received. At that point, the loop is exited and the program continues executing the instruction "NOP", which instruction results in the program being advanced to the next address. When the last address is reached, the "JUMP" instruction results in the program looping on the last address until the functional test program is completed and the test sequence processor powers down from the test procedure. In this manner, the error RAM controller is prevented from looping back to address 0. Although the trigger point is usually the first executable test vector address, it may be any valid address within the test program. The data stored in the vector memory contain a trigger bit in the first address if one occurred, and also contains all the addresses from that state until the end of the test or the end of vector memory. The data in the error memory is valid only if a trigger did occur. The test vector addresses stored in vector memory correspond to the data stored in the error memories at those same addresses. The data stored in the vector and error memories are sent back to test controller 60 under control of test sequence processor 68 when the test has been completed. For the sequential data collection mode, the collected data is already listed in the correct order in which it occurred during the test. Accordingly, the test sequence processor only checks that the first state has a trigger bit in the first address (thereby verifying that the data was collected during the test) and sends the data for each address to controller 60.

In the window data collection mode, the program written to the error RAM controller must provide a means for setting aside a specified number of test states before and/or after the trigger occurs. This data collection mode may be implemented by configuring the error controller program to include a series of loops which wait for the trigger to occur. The number of states collected before and after the trigger may be set to zero by default, so that only triggered states are collected. An example of a program listing which accomplishes this function is illustrated in FIG. 6(b). The instruction at each address loops back to its own address until a trigger occurs, at which point the loop at that address is exited and the program begins looping on the next succeeding address. Again, when the last address is reached, the program loops on that address until the test is completed. As a result, each time that the trigger occurs, data for the triggered state will be stored in the vector and error memories. However, since the stored data does not necessarily occur one state after another, the stored data may be disjoint. At the end of the test, the data is checked for the presence of the trigger bit, and valid data is sent to test controller 60.

Figure 6D:
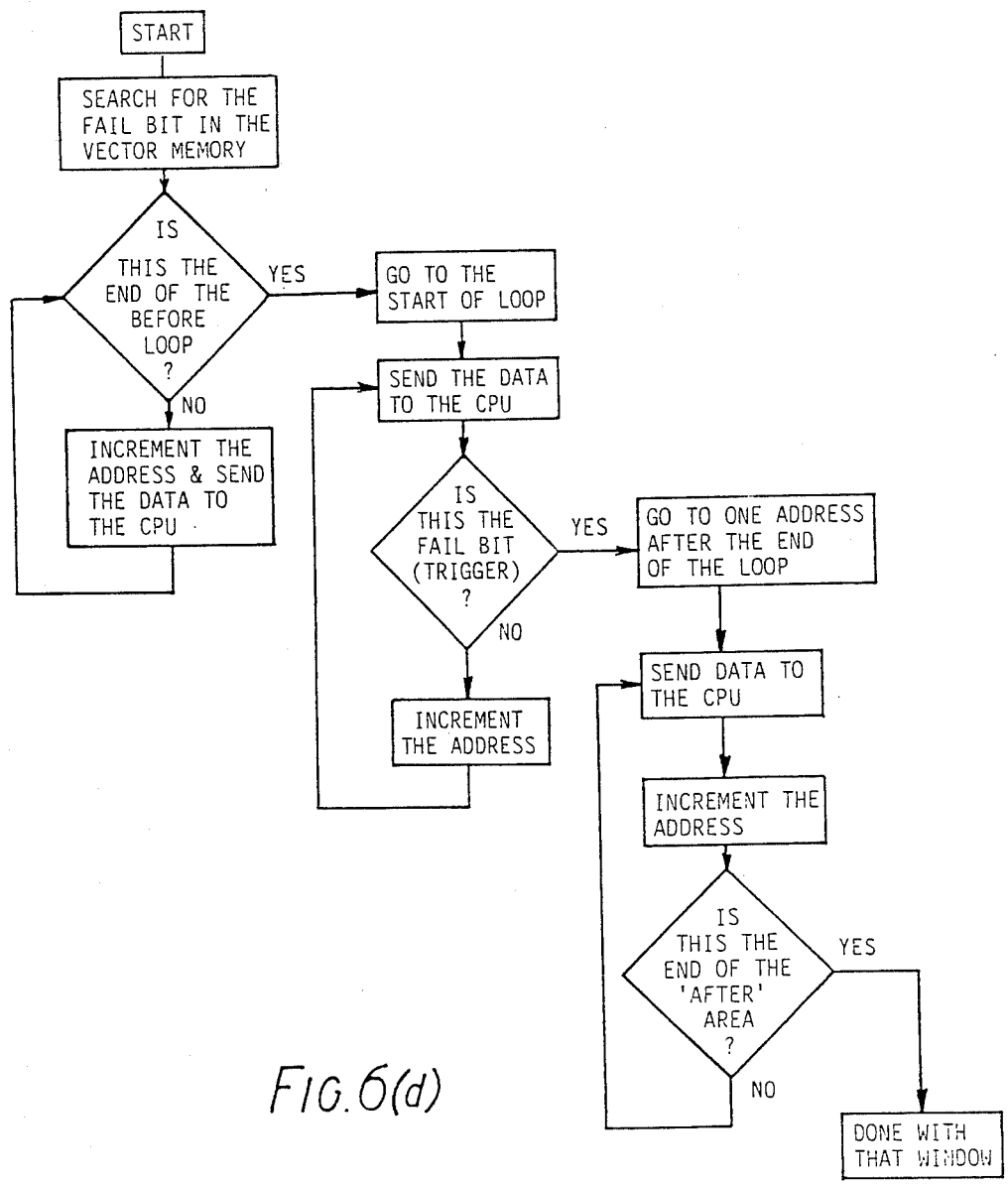
FIG. 6(d) is a flowchart schematically illustrating one method that may be employed in the present invention for reading data from the error controller to the test controller.

For the case where data is collected before and/or after a trigger occurs, the loops which wait for the trigger are the length of the number of states to be collected before or after the trigger occurs, rather than looping on a single address. An example of a program listing for collecting data five states before and five states after the trigger is illustrated in FIG. 6(c). For the listing shown, the program loops between addresses zero and five until a trigger occurs, at which point the program jumps to address six. For addresses six to A the program collects the five states of data after the trigger. If a second trigger occurs while the program is trying to collect the five states of data after the first trigger, the program jumps to the next address which is five states more than the end of the data collection area which was interrupted. In order to read the collected data from the error RAM controller to test controller 60, the collected data must be read back in the order it was collected, rather than the order it appears in memory. To do so, the data from the first before/after area is read first. The data stored in the vector and error memories is controlled by the start address of the loop, the end address of the loop, and the end of the five after address area. The data stored between addresses zero and five is divided by a point which is the address of where the trigger occurred. Data stored at addresses after that point and up to the end of the loop at address five, (if any) are sent first. Then the data stored from the start of the loop at address zero up to and including the data at the dividing point address are sent to controller 60. Next the data in the five after area (addresses six through A) are sent by reading those memory locations. In this manner, the order of the data received by test controller 60 is the actual order of execution during the test. A flow chart which schematically illustrates this procedure is shown in FIG. 6(d).

Figure 7:
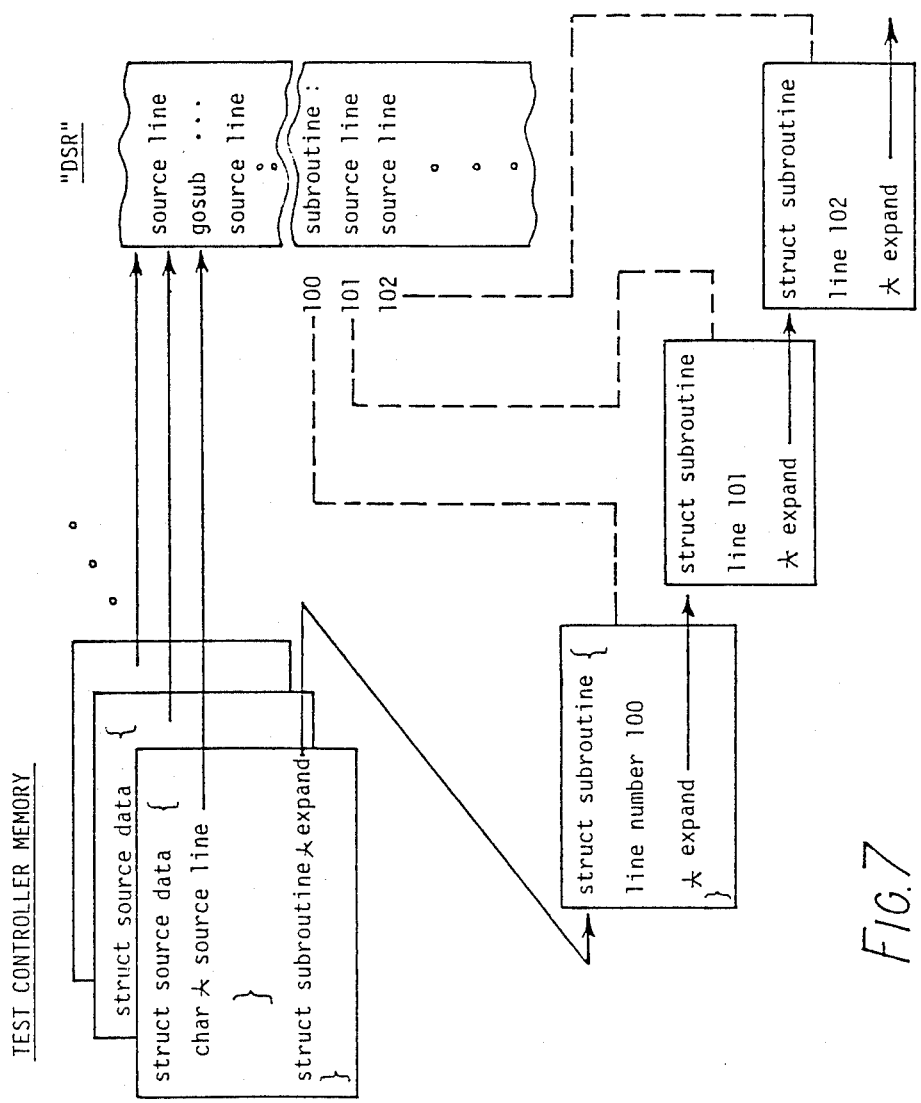
FIGS. 7, 8, and 9 schematically illustrate the type of data structures which may be employed to correlate data obtained during testing to the program statements used to perform such testing, in accordance with the method of the present invention.

As for the last step in the testing procedure, of correlating the device terminal data to the program source code, when the testing system illustrated in FIG. 1 is utilized and controller 60 comprises a personal computer such as the IBM PC/AT, the correlation can be accomplished by arrays of data structures which contain pointers and which are linked by a unique state address assigned to each executable statement in the program source file. First a directory file named "DSR" is generated during step (2) of the testing procedure, when the test file for the device is loaded into memory. At that time, an array of data structures is allocated for the lines of the source file, with one data structure being allocated per line of source code. The source lines are then read into this source-data structure array. Each executable statement in this source code is assigned a unique state address, which address is the same as the address for the binary test file element corresponding to that executable statement. The state address corresponding to each source line in the source-data structure is also loaded into that data structure. It should be noted that, because some of the lines of the source code are not executable statements, some source line entries in the source-data file will not have a state address associated therewith. Various other pieces of information may also be loaded into the source-data structures in order to create the DSR file. Furthermore, various pointers may be set and linked lists of labels and subcalls may be made. As a final step in generating the DSR file, the subroutine links for the source code entries in the source-data structures are updated so that the source-data entries may be expanded out sequentially for every statement encountered during the testing. This linking includes recursively expanding all subroutine calls as well as listing destinations for jump statements. The structure map in the memory portion of test controller 60 after the DSR file has been generated in the above manner is schematically illustrated in FIG. 7.

Figure 8:
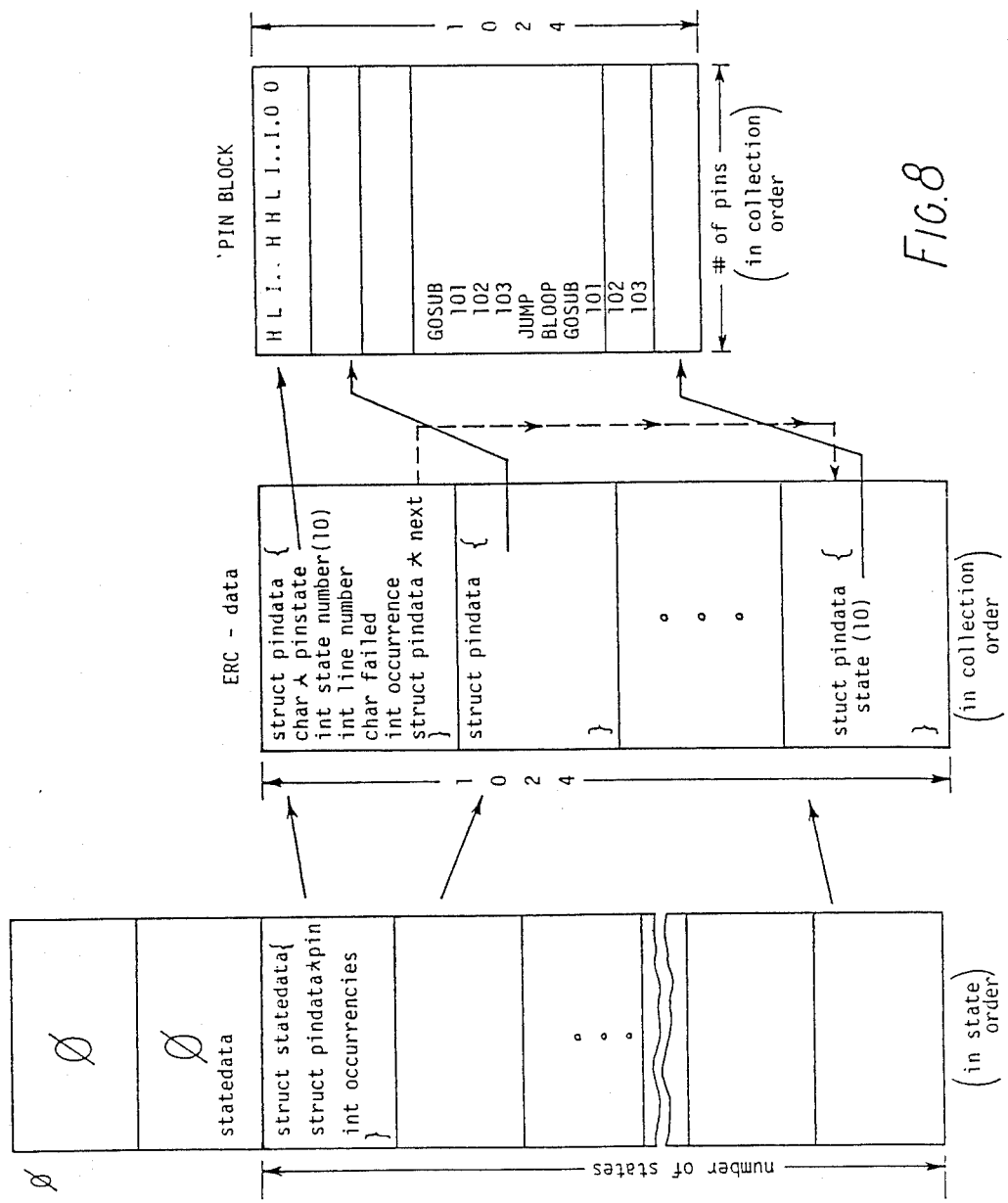
Figure 9:
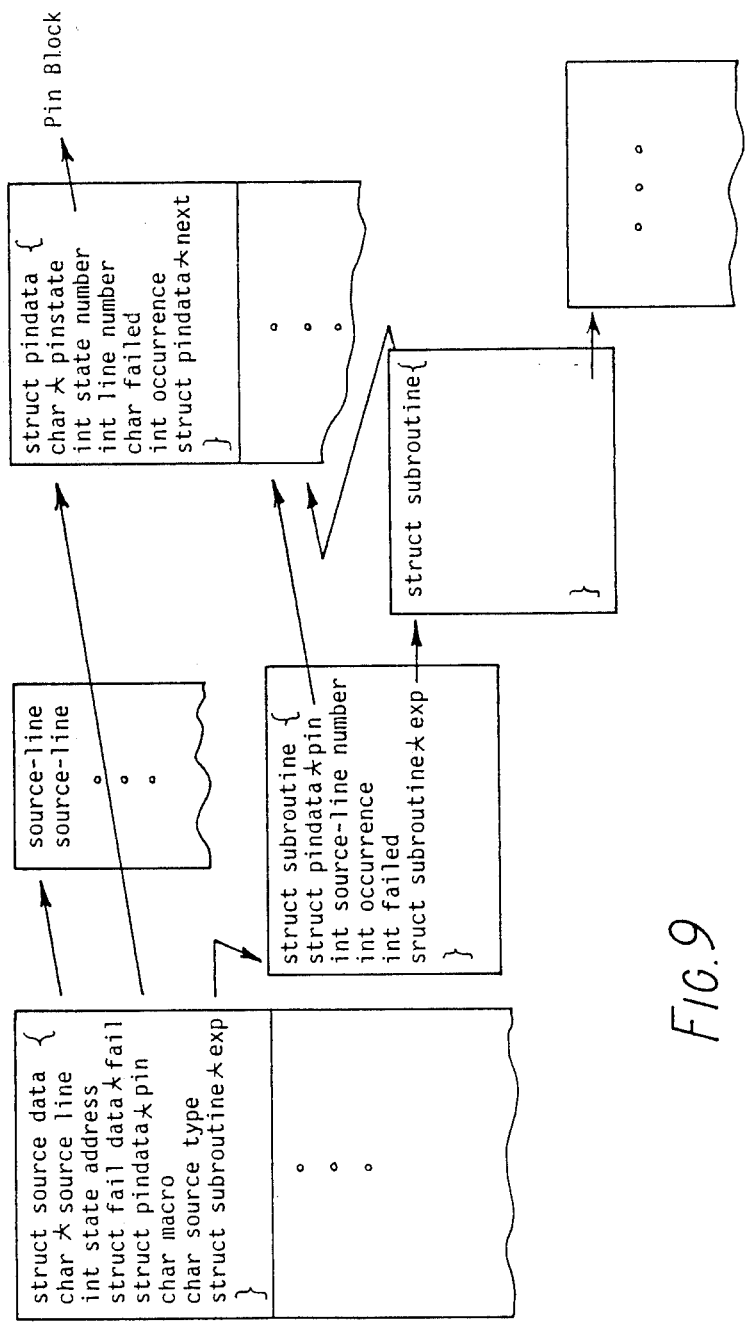

After the test has been run, data is retrieved from the error RAM controller in the correct sequence that the data was collected during the test, and in the correct order of the device terminal number. For the sake of labelling the location in controller 60 into which the data is read, that file is named pin block. An array of pin-data structures is allocated, with each structure having a pointer called pinstate which is associated with a unique piece of data in pin block. Preferably, the array of pin-data structures includes means for linking together succeeding occurrences in those data structures of the same state address. An array of state-data structures is also generated, one for each state address of the test. The pointers in the state-data structures are set so that each state-data structure points to the first occurrence of that state address in the pin-data array. The data structure map resulting from these steps is schematically illustrated in FIG. 8. Data from the error RAM controller has been translated and stored in the pin block as an array of strings, each string representing the values of the device terminals for a single state of the test. A block of pin-data structures is built to track the data coming out of the error controller. Each pin-data structure represents one string in the pin-block. After all of the data has been retrieved from the error controller, a state data structure is built which provides a pointer for each state address in the test to the first occurrence of that state in the data from the error controller. Each succeeding occurrence of that state in the data is linked together in this structure. Finally, the address of the pin-data structure associated with each source-data structure is loaded into that source-data structure, in order to generate the connections from the source-data structures to the pin-data structures. This operation is carried out by using the state data array. For each source-data structure, the state address contained therein is used to index into the state data structure, and the state data structure is used, in turn, to obtain the address for the first occurrence of the pin-data structure which corresponds to that state address. The corresponding pin-data structure address contains the pointer to the data from the error controller.

The exception to this technique for linking the source-data structures to the pin-data structures is for subroutine statements. For those source-data structures the state data array is not used, because, for subroutine statements, the second and succeeding occurrences of the pin-data structure have the same state address. Instead, a pointer to the state data, along with the fact that the data for an expanded subroutine occurs in sequential order, may be used to find the correct pin-data structure for the subroutine statement involved. One method is to account for previous occurrences of that state data address, and index down an appropriate number determined by the number of previous occurrences. Another method is to determine whether or not the state data address has occurred once, and then use the first link in the pin-data structure. The linked data structures resulting from the data collection and correlation procedures described above are schematically illustrated in FIG. 9.

The foregoing describes a system for testing the integrity and performance of electronic devices which are connected in an operable circuit. The testing system provided by the present invention is especially useful for testing integrated circuits mounted on printed circuit boards. The apparatus and methods utilized for the testing system also provide a high rate of tester throughput. Furthermore, the data collection and correlation procedures of the present invention provide a testing system for which the testing program is easily debugged.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A method for testing an electronic circuit device while said device is electrically connected in the circuit for which said device is to be employed, said circuit device having a plurality of electrical terminals through which said device is operated in accordance with its intended circuit function, said method comprising:
   (a) applying electrical power to said circuit containing said device, so as to activate said circuit;
   (b) connecting a tester clip mechanism to said terminals of said circuit device;
   (c) electrically determining the physical orientation of said circuit device terminals with respect to said tester clip mechanism;
   (d) electrically determining whether said circuit device terminals are each in electrical contact with said tester clip mechanism; and
   (e) electrically determining whether said circuit device terminals are each properly electrically connected in said circuit containing said circuit device.

2. The method of claim 1 further comprising:
   (f) functionally testing said circuit device by applying prescribed electrical stimulus signals to preselected ones of said circuit device terminals and comparing the electrical signals appearing at said circuit device terminals in response to said stimulus signals with predetermined standards.

3. The method of claim 2 wherein step (f) of functionally testing said circuit device is conducted in accordance with the determination made in step (c) of the physical orientation of said circuit device terminals with respect to said tester clip mechanism without physically re-orienting the tester clip mechanism relative to said terminals of said circuit device.

4. The method of claim 3 wherein step (f) of functionally testing said circuit device is conducted in response to establishing in step (d) that all of said circuit device terminals are in electrical contact with said tester clip mechanism, and also in response to establishing in step (e) that said circuit device terminals are each properly electrically connected in said circuit containing said device.

5. The method of claim 1 further comprising:
   (g) applying prescribed electrical signals to preselected locations in said circuit containing said circuit device, so as to establish predetermined initial testing conditions in said circuit.

6. The method of claim 5 wherein said circuit comprises a printed circuit board containing a plurality of interconnected integrated circuits, with each integrated circuit being contained in a package having a plurality of terminals and being connected into said circuit by means of said plurality of integrated circuit device terminals, and wherein the prescribed electrical signals of step (g) are applied to preselected ones of said integrated circuit device terminals by connecting additional tester coupling mechanisms, to said preselected device terminals.

7. The method of claim 6 wherein at least one of said integrated circuits comprises a dual-in-line packaged integrated circuit.

8. The method of claim 2 further comprising:
   (h) storing as failure data the electrical signals appearing at said circuit device terminals in response to said stimulus signals, when said response signals are substantially different from said predetermined standards.

9. The method of claim 8 further comprising:
   (i) correlating said failure data signals to the particular test conditions and stimulus signals being applied during said functional testing when said failure data occurred.

10. The method of claim 1 wherein step (c) of determining said physical orientation comprises comparing the electrical signals appearing at preselected ones of said circuit device terminals with the signals expected at those preselected terminals when said circuit device terminals are in a predetermined physical orientation with respect to said tester clip mechanism.

11. The method of claim 10 wherein said circuit device comprises an integrated circuit contained in a package having a plurality of terminals and wherein said comparing step comprises measuring the voltage appearing at the integrated circuit package terminals which correspond to the integrated circuit's supply voltage and electrical ground.

12. The method of claim 11 wherein said integrated circuit comprises a dual-in-line packaged integrated circuit.

13. The method of claim 1 wherein, for each of said circuit device terminals, step (d) comprises:
   (d1) applying a prescribed electrical stimulus signal through said tester clip mechanism to said terminal;
   (d2) monitoring the electrical signal appearing at said terminal in response to said stimulus signal; and
   (d3) determining, in response to the signal obtained in step (d2), whether said device terminal is in electrical contact with said tester clip mechanism.

14. The method of claim 13 wherein step (d3) comprises establishing that said device terminal is in electrical contact with said tester clip mechanism when the response signal obtained in step (d2) is substantially different from the stimulus signal applied to said device terminal in step (d1).

15. The method of claim 14 wherein said prescribed electrical stimulus signal comprises a prescribed DC voltage level.

16. The method of claim 1 wherein step (e) comprises:
   (e1) determining whether the terminals of said circuit device which correspond to the device's power supply and its electrical ground are electrically connected to the power supply and ground electrical potentials provided by the circuit which contains said circuit device;
   (e2) determining whether any of the terminals of said circuit device other than those terminals tested in step (e1) are electrically connected to the power supply and ground electrical potentials provided by said circuit which contains said circuit device;
   (e3) determining whether the terminals of said circuit device which are intended to be electrically shorted to each other, when said device is connected to said circuit which contains said device, are connected together; and
   (e4) determining whether any of the terminals of said circuit device other than those tested in step (e3) are electrically shorted to any of the terminals tested in step (e3).

17. The method of claim 16 wherein step (e1) comprises measuring the voltages appearing at the terminals of said circuit device which correspond to the device's power supply and electrical ground.

18. The method of claim 16 wherein said circuit device comprises a binary logic device, and wherein step (e3) comprises:
  applying a DC voltage which corresponds to a high logic level for said circuit device to one of the terminals of said device which are intended to be electrically shorted to each other; then
  individually applying a DC voltage which corresponds to a low logic level for said circuit device to each of the other terminals of said device which are intended to be electrically shorted to each other; and
  monitoring the electrical signals appearing at said device terminals having said low logic level applied thereto.

19. The method of claim 18 wherein steps (e2) and (e4) together comprise:
  applying a DC voltage which corresponds to a low logic level for said circuit device to all of the terminals of said device other than the terminals thereof which correspond to the device's power supply and electrical ground;
  monitoring the electrical signal appearing at each of said device terminals having said low logic level applied thereto and noting as shorted to the power supply electrical potential any of said terminals for which said appearing signal is substantially different from said low logic level signal; then
  individually applying a DC voltage which corresponds to a high logic level for said circuit device to each of the terminals of said device other than the terminals thereof which correspond to the device's power supply and electrical ground, the terminals thereof which are intended to be electrically shorted to each other, and the terminals thereof which were previously noted as being shorted to the power supply electrical potential; and
  monitoring the electrical signal appearing at each of said device terminals having said high logic level applied thereto and noting any of said terminals for which said appearing signal is substantially different from said applied high logic level signal.

20. The method of claim 9 wherein said functional testing comprises executing a programmed sequence of prescribed testing conditions which cause prescribed stimulus signals to be applied to preselected ones of said circuit device terminals, in accordance with the executable statements contained in a program source file.

21. The method of claim 20 wherein step (h) further comprises storing as test data the electrical signals appearing at said circuit device terminals in response to said programmed stimulus signals, during preselected ones of said sequence of test conditions.

22. The method of claim 20 wherein step (i) comprises:
  (i1) assigning a unique state address to each executable statement contained in said program source file;
  (i2) generating a directory file which includes a listing of all of the program statements contained in said source file, with each said statement being listed each time it is encountered in the program's sequence, said statements being listed in the order encountered in said program sequence;
  (i3) associating with each executable program statement in said directory file the unique state address assigned to that executable statement in step (i1);
  (i4) generating a device terminal data file which includes a listing of all of the test data and all of the failure data stored during step (h), said test data and said failure data being listed in the order it occurred during said program sequence;
  (i5) associating with each element of said device terminal data file the state address associated in step (i3) to the corresponding executable statement in said directory file which was being executed when said device terminal data file element occurred; and
  (i6) linking each said executable statement in said directory file with the elements of said device terminal data file which have the same state address as said executable statement.

23. The method of claim 22 wherein, in step (i6), each executable statement is linked to the first occurrence of an element in said device terminal data file which has the same state address as said executable statement.

24. An apparatus for testing an electronic circuit device while said device is electrically connected in the circuit for which said device is to be employed, said circuit device having a plurality of electrical terminals through which said device is operated in accordance with its intended circuit function, said apparatus comprising:
  means for applying electrical power to said circuit containing said device, so as to activate said circuit;
  means for generating at least one test control signals in accordance with which said circuit device is to be tested;
  means for generating an address signal in response to said test control signal;
  a plurality of driver storage means, each of which is associated with a respective one of said device terminals and configured for storing a plurality of electrical stimulus-representative signals said address signal being configured for accessing a respective electrical stimulus representative signals for each of said plurality of driver storage means, wherein said electrical stimulus-representative signals, during testing, result in the simultaneous selective application of electrical stimulus signals to said device terminals in response to said generated address signal;
  a plurality of driver circuit means, each of said driver circuit means being associated with one of said driver storage means and being responsive to said electrical stimulus-representative signals, for controllably generating electrical stimulus signals for application to the associated circuit device terminal;
  means for coupling said electrical stimulus signals to the respective terminals of said circuit device; and
  means for sensing the electrical signals appearing at the terminals of said device in response to application of said stimulus signals.

25. The apparatus of claim 24 further comprising means for comparing the electrical signals monitored by said sensing means with predetermined standards.

26. The apparatus of claim 25 further comprising means for generating sensor-representative electrical signals which correspond to the electrical signals monitored by said sensing means.

27. The apparatus of claim 26 further comprising means for storing predetermined ones of said sensor-representative signals.

28. The apparatus of claim 27 further comprising means for determining which of said sensor-representative signals are stored.

29. The apparatus of claim 28 further comprising means for correlating said stored sensor-representative signals with the particular stimulus-representative signals being applied to said driver circuit means while the electrical signals associated with said stored sensor-representative signals are being monitored.

30. The apparatus of claim 24 wherein said means for generating a test control signal includes means for storing a series of test control instructions, said address generating means being responsive to a test control instruction in said test control instruction memory means for generating an address signal, which address signal is configured for both accessing a test memory means and for accessing a respective electrical stimulus-representative signal for each of said plurality of driver storage means.

31. The apparatus of claim 30 wherein each of said driver storage means includes a device terminal test control memory for storing a plurality of said electrical stimulus-representative signals in respective memory locations thereof, said memory locations being addressable by the generated address signal.

32. The apparatus of claim 24 wherein each said driver circuit means includes means for selectively coupling the output of said driver circuit means to its associated terminal of said circuit device.

33. The apparatus of claim 24 further comprising means for applying prescribed electrical signals to preselected locations in said circuit containing said circuit device, so as to establish predetermined initial testing conditions in said circuit.

34. The apparatus of claim 24 wherein said circuit comprises a printed circuit board containing a plurality of interconnected integrated circuits, with each integrated circuit being contained in a package having a plurality of terminals and being connected into said circuit by means of said plurality of device terminals.

35. The apparatus of claim 24 wherein said means for generating at least one test control signal comprises a bit-slice processor.

36. The apparatus of claim 28 wherein said means for determining which of said sensor-representative signals are stored comprises a bit-slice processor.

* * * * *